United States Patent
Khlat et al.

(10) Patent No.: US 6,678,340 B1
(45) Date of Patent: Jan. 13, 2004

(54) APPARATUS FOR RECEIVING AND PROCESSING A RADIO FREQUENCY SIGNAL

(75) Inventors: Nadim Khlat, Cugnaux (FR); Patrick Clement, Bussigney (CH)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/535,396

(22) Filed: Mar. 24, 2000

(30) Foreign Application Priority Data

Jun. 30, 1999 (EP) ............................................. 99401626

(51) Int. Cl.[7] ................................................. H04B 1/10
(52) U.S. Cl. ........................ 375/350; 455/307; 455/310
(58) Field of Search ................................. 375/261, 284, 375/285, 316, 324, 340, 346, 350; 455/43, 50.1, 63, 283, 286, 296, 303, 307, 310; 708/300; 329/318, 320, 349, 353

(56) References Cited

U.S. PATENT DOCUMENTS

| | | | | |
|---|---|---|---|---|
| 5,400,084 A | * | 3/1995 | Scarpa | 348/624 |
| 5,422,912 A | * | 6/1995 | Asser et al. | 375/350 |
| 5,828,955 A | * | 10/1998 | Lipowski et al. | 455/324 |
| 6,243,430 B1 | * | 6/2001 | Mathe | 375/346 |
| 6,356,594 B1 | * | 3/2002 | Clement et al. | 375/261 |

* cited by examiner

*Primary Examiner*—Stephen Chin
*Assistant Examiner*—Dac V. Ha

(57) ABSTRACT

Apparatus 20,30,40,50 for receiving and processing a wanted Radio Frequency signal comprises a radio frequency to intermediate frequency down-conversion stage 20 for receiving the wanted radio frequency signal and out-putting a complex intermediate frequency signal; an analogue to digital converter 30 for converting the complex intermediate frequency signal to a digital complex intermediate signal; an intermediate frequency to base-band down-conversion stage 40 for receiving the digital complex intermediate frequency signal and out-putting a digital complex base-band signal; and a complex notch filter 50 for receiving the digital complex base-band signal and out-putting a notch filtered digital complex base-band signal wherein the complex notch filter 50 substantially filters out a small portion of the base-band signal centred about a first, non-zero, frequency while substantially passing a corresponding portion of the base-band signal centred about a second frequency having the same magnitude but opposite sign to the first frequency.

15 Claims, 3 Drawing Sheets

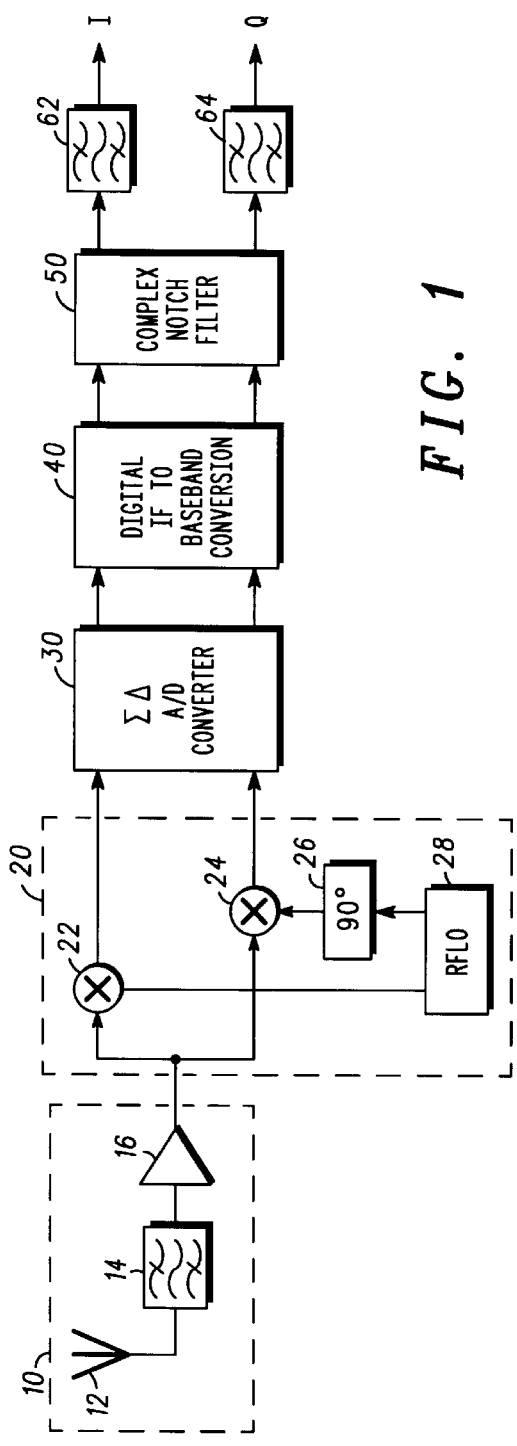
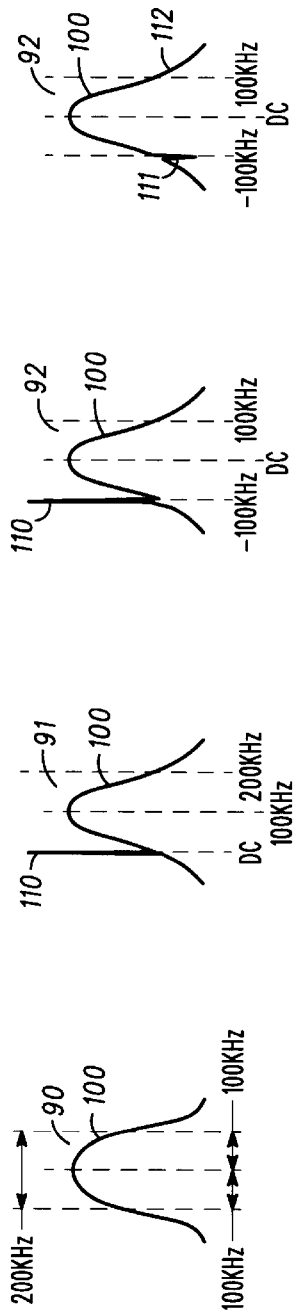

APPARATUS FOR RECEIVING AND PROCESSING A RADIO FREQUENCY SIGNAL

FIELD OF INVENTION

The present invention relates to apparatus for receiving and processing a radio frequency signal and to a method of receiving and processing a radio frequency signal, and, in particular, to a radio receiver for use in a portable communications device, in which the radio signal to be received is directly down converted to In-phase (I) and Quadrature-phase (Q) signals centred around an Intermediate Frequency (IF) which is of the same order of magnitude as the band-width of the signal to be received.

BACKGROUND OF THE INVENTION

Most conventional radio receivers for use in portable communication devices such as cellular telephones, are of the super-heterodyne type in which a radio signal to be received is first down-converted to an IF which is still in the Radio Frequency (RF) range and then further down-converted to a base-band signal (having both I and Q components) from which the information contained in the signal may be recovered. Such a receiver is robust. However, direct conversion receivers and, more recently, Very Low IF (VLIF) receivers have been proposed in order to reduce costs by eliminating both a relatively high performance, and therefore expensive, Surface Acoustic Wave (SAW) band-pass filter (for allowing the wanted IF signal to pass while blocking all unwanted IF signals in neighboring channels) and one of the two RF Local Oscillators (LO) required in super-heterodyne receivers.

Direct conversion receivers immediately down convert the received radio signal to a base-band signal thus completely eliminating the IF stage. However, such receivers suffer from the formation of a very large unwanted Direct Current (DC) noise component. This DC noise component is formed largely by leakage from the Local Oscillator being received at the receiver aerial together with the wanted signal, and also by offsets of the amplifiers and mixers in the receivers. This unwanted DC noise component must clearly be removed if the information contained in the signal is to be successfully recovered. However, because the noise to be removed is located at DC, a significant amount of time is required for a suitable DC notch filter (ie a high pass filter having a corner very close to DC with a very steep fall-off characteristic) to adapt to the correct amount of DC to remove. This time may be referred to as the DC offset adept period. The existence of the DC offset period requires that the receiver effectively be switched on some time prior to receiving the wanted signal. Furthermore, since the unwanted DC noise component is located in the middle of the wanted signal, a significant amount of useful information contained within the wanted signal will also be lost when the DC noise component is filtered out.

In order to overcome this problem, a VLIF receiver has been proposed in which the received signal is first down-converted to be centred about an IF which is equal to approximately half the channel spacing (ie approximately half the band-width of the wanted signal), and then it is down-converted again to base-band. In this way, the DC component, which is still formed when the first down conversion takes place, is located (in frequency) at the very edge of the wanted signal. From here, the unwanted DC component may be filtered out without losing so much information contained in the wanted signal. Furthermore, if one removes this unwanted noise component after down conversion from IF to base-band, the noise component will now be located away from DC and thus a suitable notch filter can remove this component without requiring the receiver to be turned on for the significant DC offset adapt period.

However, it has been surprisingly discovered that, if one attempts to use a simple real (ie non-complex) filter which not only removes the unwanted noise component, but also filters out a corresponding portion of the signal having a frequency equal in magnitude to that of the shifted DC noise component but opposite sign, a significant amount of the information contained within the wanted signal is also lost by such filtering.

SUMMARY OF THE INVENTION

In accordance with a first aspect of the present invention, there is provided apparatus for receiving and processing radio frequency signals, comprising a radio frequency to intermediate frequency down-conversion stage for receiving a radio frequency signal and outputting an intermediate frequency signal; an intermediate frequency to baseband down-conversion stage for receiving the intermediate frequency signal and outputting a base-band signal; and a complex notch-filter for receiving the base-band signal and outputting a notch-filtered base-band signal, wherein the complex notch-filter substantially filters out a small portion of the base-band signal centred about a first, non-zero, frequency whilst substantially passing a corresponding portion of the base-band signal centred about a second frequency having the same magnitude but opposite sign to the first frequency.

The term base-band signal, will be well understood by a person skilled in the art as referring to the wanted signal centred about DC and having I and Q component signals which together represent the wanted signal as a complex signal, having both positive and negative frequency components.

By providing a complex notch filter, it is possible to remove the unwanted DC noise component located at one edge of the wanted signal without removing signal information from a corresponding portion of the wanted signal at its opposite edge. In this way, the filter does not require a long DC offset adapt period before it can accurately filter away the unwanted noise, as would be the case in a direct conversion receiver. On the other hand, it has been found that using a non complex notch filter is undesirable because of the useful signal information which is lost from the other edge of the wanted signal.

Preferably, the complex notch filter is programmable to enable the frequency of the small portion filtered out of the base-band signal to be altered as desired. This enables the apparatus for receiving and processing radio frequency signals according to the present invention to be easily modified to accommodate different standards (e.g. GSM, US TDMA, etc.).

Preferably, the complex notch filter has an asymmetrical response around the notch. By asymmetrical response, it is meant that the response of the filter is sharper (i.e. that it will remove less of the signal removed from the notch) on one side of the notch compared to the other. This is advantageous in the present invention since the wanted signal occurs substantially only on one side of the notch so that any removal of signal on the other side of the notch will not adversely affect the reception of wanted information contained within the wanted signal. Note that the ability to use an asymmetrical notch filter, requires that the notch filter be located not at DC (since this would then just be a simple high pass filter which cannot be made complex). For this reason, it is particularly advantageous to place the complex notch filter after the complex balanced multiplier or IF to base-band down-conversion stage.

Preferably, the apparatus includes an analogue to digital converter (ADC) which is arranged to convert one of the Radio Frequency (RF), Intermediate Frequency (IF) or base-band signals from an analogue into a digital signal. Ideally, the ADC is arranged to convert the IF signal from analogue into digital. Clearly, if a straight forward low pass ADC is used, it is necessary that the sampling frequency used to convert the analogue signal into a digital signal, is at least twice as great as the maximum frequency component contained in the analogue signal to be converted into digital. By providing a Very Low IF (VLIF) whereby the wanted signal is down-converted to be centred about an IF of approximately half the bandwidth of the wanted signal, the down-converted wanted signal will occupy a frequency band from approximately 0 Hz to the bandwidth of the wanted signal. This means that the sampling rate only needs to be about twice as large as the bandwidth of the wanted signal.

Preferably, the RF to IF down conversion stage outputs the IF signal as a complex IF signal comprising first and second Quadrature IF component signals. This is advantageous as it enables one to distinguish between signals and signal images located in the frequency range which is passed by the ADC (ie between minus the bandwidth of the wanted signal and plus the bandwidth of the wanted signal).

As mentioned above, it is preferred that the wanted signal, when down-converted to a VLIF signal, is centred about a VLIF which is about the same order of magnitude as the bandwidth of the wanted signal. In particular, it is preferred that the wanted signal, when down-converted to a VLIF signal, is centred about a VLIF which is about half the bandwidth of the wanted signal. The exact choice of VLIF about which the wanted signal is to be centred, will depend on exactly what type of signals the apparatus is to receive and process. In the case of GSM signals, it is preferred that the VLIF about which the wanted signal is centred, should be within the range of half the channel separation frequency ±10%. Ideally, it will be within the range of half the channel separation frequency +5%. However, in the case of signals having a greater order of modulation (as is anticipated for EDGE [Enhanced Data for GSM Evolution]) the VLIF about which the wanted signal should be centred, is preferably in the range of half the channel separation frequency +10%–20%. Note that the term channel separation frequency will be well understood by a person skilled in the art to mean the separation in frequency between adjacent channels defined by measuring corresponding points in the different channels (eg the distance between the midpoints of adjacent channels will equal the channel separation frequency).

Preferably, the complex notch filter includes first and second Finite Impulse Response (FIR) filters having different first and second sets of coefficients associated therewith respectively, wherein one of the sets of coefficients corresponds to the real parts of a set of complex coefficients and the other set of coefficients responds to the imaginary part of the same set of complex coefficients. By ensuring that both the I and Q components of the base-band signal are filtered by both the first and second FIR filters (thus generating four filtered signals) and combining the signals produced thereby in an appropriate manner, the result is that of an FIR filter having complex coefficients operating upon a complex signal whose imaginary and real parts are given by the Q and I component signals.

Preferably, the complex notch filter includes inversion means whereby the outputs of one or more of the FIR filters may be inverted to thereby alter the operation of the complex notch filter such that the complex notch filter substantially passes the small portion of the base-band signal centred about the first frequency while substantially filtering out the corresponding portion of the base-band signal centred about the second frequency.

Preferably, the apparatus is formed as an integrated circuit.

According to a second aspect of the present invention, there is provided apparatus for receiving and processing a wanted Radio Frequency signal comprising a radio frequency to intermediate frequency down-conversion stage for receiving the wanted radio frequency signal and outputting a complex intermediate frequency signal; an analogue to digital converter for converting the complex intermediate frequency signal to a digital complex intermediate signal; an intermediate frequency to base-band down-conversion stage for receiving the digital complex intermediate frequency signal and outputting a digital complex base-band signal; and a complex notch filter for receiving the digital complex base-band signal and outputting a notch filtered digital complex base-band signal wherein the complex notch filter substantially filters out a small portion of the base-band signal centred about a first, non-zero, frequency while substantially passing a corresponding portion of the base-band signal centred about a second frequency having the same magnitude but opposite sign to the first frequency.

According to a third aspect of the present invention, there is provided a method of receiving and processing a wanted Radio Frequency signal comprising the steps of receiving the wanted Radio Frequency signal and down-converting it to a complex intermediate frequency signal; converting the complex intermediate frequency signal from an analogue signal into a corresponding digital signal; converting the digital intermediate frequency to a digital base-band signal; and filtering the digital base-band signal with a complex notch filter in order to filter out a small portion of the base-band signal centred about a first, non-zero frequency whilst substantially passing a corresponding portion of the baseband signal centred about a second frequency having the same magnitude but opposite sign to the first frequency.

BRIEF DESCRIPTION OF THE DRAWINGS

In order that the present invention may be better understood, embodiments thereof will now be described by way of example only, with reference to the accompanying drawings in which:

FIG. 1 is a block diagram of apparatus for receiving and processing a radio frequency signal in accordance with the present intention.

FIG. 2 is a series of frequency spectrum sketches illustrating the progress of a wanted radio frequency signal through the various processing stages of the apparatus of FIG. 1;

DETAILED DESCRIPTION OF THE INVENTION

Figure 3:
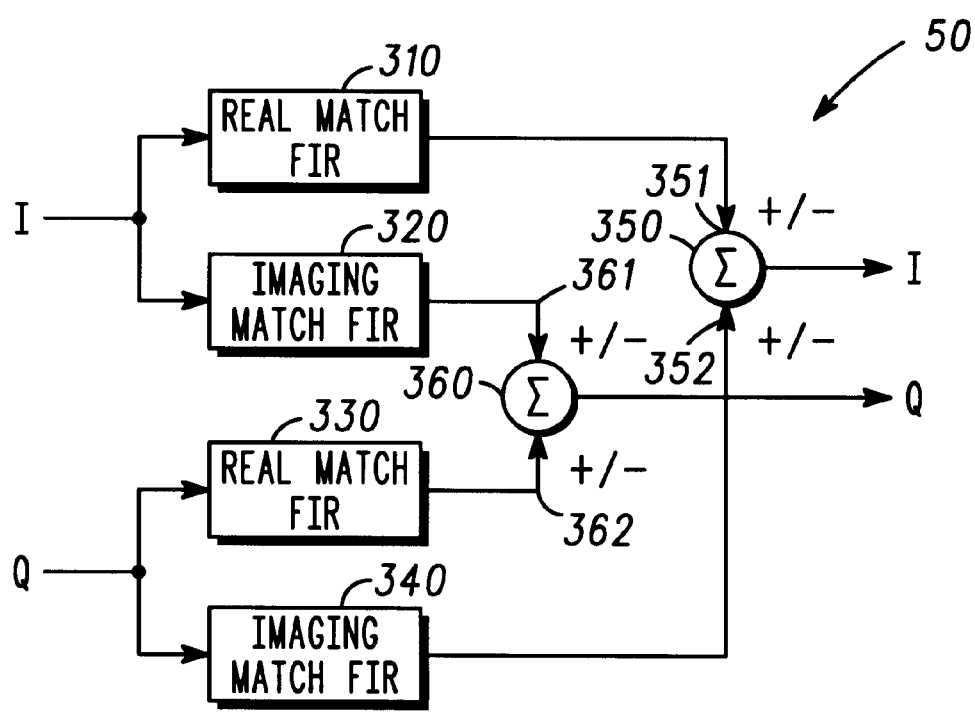
FIG. 3 is a block diagram of a complex notch filter suitable for use in the present invention.

Referring firstly to FIG. 1, apparatus 20, 30, 40, 50 for receiving and processing a signal in accordance with the present invention, is shown together with additional circuitry 10, 62, 64 which is located on either side of the apparatus according to a preferred embodiment of the present invention. Additional circuitry 10 preceding apparatus 20, 30, 40, 50, comprises an aerial 12 for receiving any radio frequency signals impinging thereon, a radio frequency band pass filter 14 for filtering out radio frequency signals widely separated from the frequency range of interest and a Low Noise amplifier 16 for amplifying the radio frequency signals which are passed by the pass band filter 14.

The output of the Low Noise amplifier 16 is then fed into the apparatus for receiving and processing a radio frequency signal in accordance with the present invention. This apparatus comprises a Radio Frequency (RF) to Intermediate Frequency (IF) down conversion stage 20, an analogue to digital converter 30, an IF to base-band downconversion stage 40, and a complex notch filter 50.

The RF to IF down conversion stage 20 comprises an In-phase (I) RF mixer 22, a Quadrature-phase (Q) RF mixer 24, a quadrature phase-shifter 26 and a Radio Frequency Local Oscillator (RFLO) 28. RFLO 28 generates RF signals whose frequency is such that the difference between the frequency of the signals generated by RFLO 28 and the central frequency of the wanted RF signal is equal to approximately half the channel spacing of the series of channels, one of which contains the wanted signal. One of the signals is applied directly to I mixer 22 while the second is applied to the quadrature phase-shifter 26 where its phase is shifted from that of the signal applied to mixer 22 by a quarter of a cycle and then applied to the Quadrature (Q) RF mixer 24. Also applied to mixers 22, 24 is the output of the Low Noise amplifier 16. The signals output by the I and Q mixers 22 and 24 are then low-pass filtered to substantially remove the majority of all of the unwanted signals and components whilst passing all of the wanted signal. Note, that for the sake of simplicity, these filters have not been shown; however, they can be thought of as being included in the analogue to digital converter 30 discussed below. Note, that because of the frequency of the signals produced by RFLO 28 the resulting IF signal is commonly termed a Very Low Intermediate Frequency (VLIF) signal since the wanted Intermediate Frequency signal is centred about a VLIF which is of the same order of magnitude as the band-width of the wanted signal.

The output I and Q signals from RF mixers 22 and 24 respectively are then input to the analogue to digital converter 30. As mentioned above, analogue to digital converter 30 can be thought of as including a low pass filter or low pass filters for individually filtering both the I and Q signals and for removing all unwanted signals and signal components whose frequencies exceed that of the highest frequency components in the wanted IF signal. If one considers GSM type signals as an example, the channel separation of GSM signals is 200 KHz, a wanted RF signal might, for example, be centred about a Radio Frequency of 900 MHz and will extend for approximately 900 MHz±100 KHz. RFLO 28 could then generate a signal at approximately either 900 MHz+100 KHz or 900 MHz−100 KHz. The wanted signal after down conversion will then be centred either about −100 KHz or about +100 KHz and will occupy the band from DC to ±100 KHz. All of the other radio signals contained in neighboring channels will also be down-converted by the mixers 22, 24 but will occupy, in general higher frequency portions of the spectrum and these are mostly filtered out before passing the wanted IF signal through the analogue to digital converter 30.

Analogue to Digital Converter (ADC) 30, is preferably a sigma delta ADC, the construction of which is well known in the art and will not be discussed here in further detail. The digitised intermediate frequency signals are then passed to the IF to base-band down conversion stage 40. At the IF to base-band conversion stage 40, the wanted IF signal is further down-converted to base-band (it to be centred about DC) of the IF to base-band down conversion stage 40. A suitable such IF to base-band down conversion stage is described in greater detail in co-patenting European Patent Application No. EP1058378 entitled Complex Multiplier which was filed on Jun. 1, 1999 and published Dec. 6, 2000. However, in simple terms, IF to base-band down conversion stage 40 can be thought of as comprising a complex multiplier arrangement for multiplying the IF signal output by the ADC 30 by a second complex signal whose frequency is minus that of the central frequency of the wanted IF signal. It will be understood by a person skilled in the art that such a complex multiplication will require the mixing of the I and Q components of the IF signal. If there Is an imbalance between the I and Q components of the IF signal, this would tend to result in unwanted image signals appearing in the wanted baseband signal. To minimize such unwanted affects, the IF to base-band conversion stage preferably includes I and Q balancing means. Such balancing means are more fully described in the co-pending European Application referred to above.

The base-band I and Q signals output by the IF to base-band conversion stage 40 are then input to the complex notch filter 50. The purpose of the complex notch filter 50 is to remove a spike of noise (ie noise which although it may have a large amplitude is located base-band signal located the same distance from DC as the unwanted noise signal but having an opposite sign. A suitable arrangement for performing the complex notch function is described in greater detail below.

The output I and Q signals from the complex notch filter 50 will then be further filtered by selectivity filters 62, 64 to remove any unwanted signal components whose frequency exceeds that of the highest frequency components of the wanted signal. The output I and Q signals from the selectivity filters 62, 64 would then be further processed by a suitable digital signal processor to recover the original information used to modulate the wanted carrier radio frequency signal.

Turning now to FIG. 2, FIGS. 2a, 2b, 2c and 2d illustrate a wanted signal 100 at different stages of processing by the apparatus shown in FIG. 1. In FIG. 2a, the wanted signal 100 is centred about a radio frequency of 0.9 GHz. The channel in which the wanted signal is substantially contained is 200 KHz wide and extends from one outside dotted line to the other. Wanted signal 100 forms part of a larger radio frequency signal 90 which includes signals from other channels etc but for the sake of clarity, we are considering radio frequency signal 90 to consist entirely of the wanted signal 100 and the effects of adjacent and alternate signals is ignored for the purposes of the present application.

In FIG. 2b, wanted signal 100 has been down-converted by the RF to IF down-conversion stage 20 such that it is now centred about 100 KHz. In addition to the wanted signal 100, there is also shown a spike 110 at DC. Spike 110 and wanted signal 100 together with any further noise or signals (not shown) form the total IF signal 91. The spike 110 represents unwanted DC noise caused by leakage from the RFLO 28 being received at the receiver aerial 12 together with the wanted signal, and also by second order non-linearities in any of the analogue components contained in the I and Q signal paths prior to conversion into digital signals by the sigma-delta ADC 30.

Note that in addition to the DC noise shown in the figure, there will in practice also be another source of noise commonly referred to as 1/f or flicker noise which is caused by resistors mainly. The effect of this noise is to cause the DC spike 110 to in fact have a finite spectrum extending to plus and minus 10 KHz, in the present example. Since the 1/f noise will be shifted together with the DC noise, removal of the DC noise, described below, will also result in removal of the 1/f noise. Furthermore, the width of the filter, described below, can easily be arranged to remove the 1/f noise in addition to the DC noise.

In FIG. 2c, the wanted signal 100 has been further down-converted by the IF to base-band conversion stage 40. As a result of this further down-conversion to base-band, the unwanted spike 110 has also been down-converted to be located at approximately −100 KHz. Thus, in FIG. 2c, there is a total base-band signal 92 which comprises wanted signal 100 centred about DC, unwanted spike 110 and any further noise or signals (not shown).

In FIG. 2d, the total base-band signal 92 now comprises wanted signal 100 together with notch 111. This represents the base-band signal 92 after having been further processed by the complex notch filter 50. Note that the portion 112 of the wanted signal 100 which corresponds to notch 111 by having an equal frequency but opposite sign (ie portion 112 is located at +100 KHz as opposed to notch 111 which is located at −100 KHz) is not affected by the complex notch filter 50. That is to say that there is not a corresponding notch at 112 as would be the case if a non-complex filter were used.

Turning now to FIG. 3, the block diagram illustrates a possible high level arrangement for complex notch filter 50. From FIG. 3 it can be seen that complex notch filter 50 comprises a first real notch Finite Impulse Response (FIR) filter 310, a first imaginary notch FIR filter, a second real notch FIR filter 330 and a second imaginary notch FIR filter 340. Complex notch filter 50 also includes a first adder/subtractor 350 having a first input 351 and a second input 352 and a second adder/subtractor 360 having a first input 361 and a second input 362. The first real and imaginary notch FIR filters 310, 320 are adapted to receive the I component of the complex base-band signal and the second real and imaginary notch FIR filters 330, 340 are arranged to receive the Q component of the base-band signal as output by the IF to base-band down-conversion stage 40 of FIG. 1. The output of the first real and imaginary notch FIR filters 310, 320 are input to the first input 351, 361 of the first and second adder/subtractors 350, 360 respectively. Similarly, the second real and imaginary notch FIR filters 330, 340 are input to the second inputs 362, 352 of the second and first adder/subtractors 360, 350 respectively.

In order to understand the operation of the complex notch filter 50 shown in FIG. 3, one should consider that the base-band signal output by the IF to base-band down-conversion stage 40 is a complex signal $x(k)$ given by:

$$x(k)=I(k)+jQ(k) \qquad \text{Equation 1}$$

where $I(k)$ represents the sample values flowing along the I path and $Q(k)$ represents the sample value flowing along the Q path.

A normal, real FIR type of filter can be represented mathematically by its Z-domain transfer function, H (z) given by:

Where the coefficients $A_0, A_1, A_2$ are the filter coefficients and are all real in this case.

$$H(z)=A_0+A_1Z^{-1}+A_2Z^{-2}+\ldots$$

The equations which describe the operation of a filter with a given transfer function can be expressed:

$$Y(z)=X(z)H(z) \Leftrightarrow y(k)=x(k) \cdot h(k) \qquad \text{equation 3}$$

ps where $Y(z)$ is the z-transform of $y(k)$ which is the output signal in the time-domain, $X(z)$ is the z-transform of $x(k)$ and $h(k)$ is the inverse z-transform of $H(z)$. Expanding the second part of Equation 3 gives:

$$y(k)=A_0x(k)+A_1x(k-1)+A_2x(k-2)$$

$$=A_0(I(k)+jQ(k))+A^1(I(k-1)+jQ(k-1))+\ldots \qquad \text{equation 4}$$

$$\rightarrow y_I(k)=A_0I(k)+A_1I(k-1)+A_2I(k-2)+\ldots \qquad \text{equation 5}$$

$$\rightarrow y_Q(k)=A_0Q(k)+A_1Q(k-1)+A_2Q(k-2)+\ldots \qquad \text{equation 6}$$

By inspection of equations 5 and 6, one can deduce that to filter complex vector data of the form: $x(k)=I(k)+jQ(k)$, through a non-complex coefficient FIR filter, placing identical filters on both the I and Q paths is sufficient, and this is the normal way to construct an FIR filter. However, such a filter has a symmetric response about DC. In order to overcome this drawback, a complex filter can be generated by taking a non-complex filter with a larger than desired notch response (eg at 150 KHz) and then shifting this response either one way or the other to have asymmetrical notches (eg at −100 KHz and +200 KHz). In order to effect this shifting, one can take a non-complex FIR filter having a transfer function as set out in equation 2 and multiply each coefficient by a constant coefficient of the form $\exp\{jn\omega_{shift}\tau\}$, where n is the coefficient index (representing the time associated with a sample having coefficient n, the actual time of the sample being given by $n\tau$ where $T\tau$ is the sampling period of the signal $x(k)$). Substituting $z=e^{j\omega r}$ in Equation 2 gives:

$$H(e^{j\omega r})=A_0+A_1e^{j\omega r}+A_2e^{j2\omega r}+\ldots$$

And multiplying each term by $\exp\{jn\omega_{shift}\tau\}$ gives $$H'(e^{j\omega r})=A_0+A_1e^{-j\omega r}e^{j\omega shift}\tau+A_2e^{j2\omega shift}\tau+\ldots$$

$$=A_0+A_1e^{-j(\omega-\omega shift)}\tau+A_2e^{-j2(\omega-\omega shift)}\tau+\ldots$$

which, effectively, shows a spectral response frequency shift of $\omega_{shift}$ from the original transfer function $H(z)$. Now to maintain a constant coefficient difference equation structure, each coefficient of the real-coefficient transfer function is just multiplied by the complex shifting coefficient, as follows:

$$H'(z)=A_0+A_1e^{j\omega shift}Z^{-1}+A_2e^{j2\omega shift}Z^{-2}+A_3e^{j3\omega shift}Z^{-3}+\ldots$$

Expanding the shifting coefficients $\exp\{jn\omega_{shift}\tau\}$ into their (a+jb) form and setting $C_{in}=a.A_n$ and $C_{qn}=b.A_n$ gives a new equation with all complex coefficients as below:

$$H(z)=(C_{i0}+jC_{q0})+(C_{i1}+jC_{q1})Z^{-1}+(C_{i2}+jC_{q2})Z^{-2}+\ldots =C_{i0}+\ldots$$
$$.C_{i1}Z^{-1}+C_{i2}Z^{-2}+\ldots +j[C_{q0}+C_{q1}Z^{-1}+C_{q2}Z^{-2}+\ldots]$$

Again, the time domain representation of this transfer function is a constant coefficient difference equation which filters an input signal x(k), as below:

$$Y(z)=X(z)H(z) \Leftrightarrow y(k)=x(k) \cdot h(k) \;\; y(k)=C_{i0}x(k)+C_{i1}x(k-1)+C_{i2}x(k-2)+\ldots +j[C_{q0}x(k)+C_{q1}x(k-1)+C_{q2}x(k-2)+\ldots]$$

Now, substituting I(k)+jQ(k) for x(k) throughout, we arrive at the following equation after multiplying through and pairing:

$$y(k) = C_{i0}I(k) + C_{i1}I(k-1) + C_{i2}I(k-2) + \ldots -$$
$$[C_{q0}Q(k) + C_{q1}Q(k-1) + C_{q2}Q(k-2) + \ldots] +$$
$$j\begin{bmatrix} C_{q0}I(k) + C_{q1}I(k-1) + C_{q2}I(k-2) + \ldots \\ C_{i0}Q(k) + C_{i1}Q(k-1) + C_{i2}Q(k-2) + \ldots \end{bmatrix}$$

Physically, this is exactly what is implemented in the complex filter 50 of FIG. 3. The adder/subtractors 350,360 additionally have programmable signs so as to be able to shift the notch spectrum either left or right depending on the mixing action of the complex multiplier 50.

Thus, turning back to FIG. 3, one can see that the first and second real notch FIR filters 310,330 are really just normal FIR filters with coefficients $C_{i0}$, $C_{i1}$, $C_2$ ... and the first and second imaginary notch FIR filters 320,340 are just normal FIR filters with coefficients $C_{q0}$, $C_{q1}$, $C_{q2}$ ... Furthermore, one can see that the normal desired settings for the inputs 351,352,361,362 to the adder/subtractors 350,360, would be to have all of the inputs 351, 361, 362 as non-inverting or adding inputs except for the second input 352 of the first adder/subtractor 350. However, to shift the response of the filter in the other direction, one would invert the inputs 361, 352 to the adder/subtractors 360, 350 which are receiving the signals from the first and second imaginary notch FIR filters 320, 340. This is apparent when considering that $e^{j\omega_{shift}\tau}=\cos(\omega_{shift}\tau)+i\sin(\omega_{shift}\tau)$ and $e^{-j\omega_{shift}\tau}=\cos(\omega_{shift}\tau)-i\sin(\omega_{shift}\tau)$.

Figure 4:
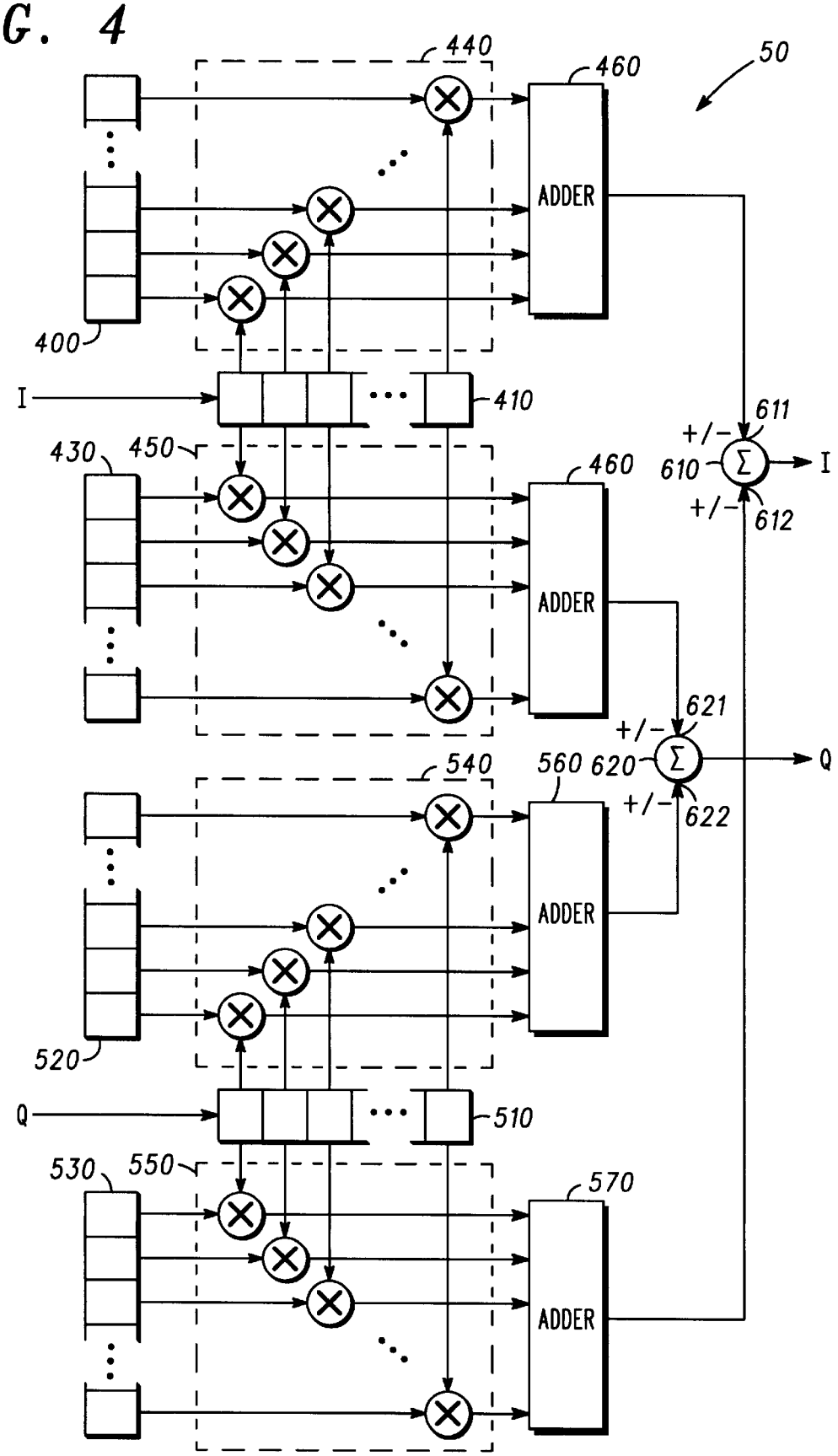
FIG. 4 is a more detailed illustration of a complex notch filter suitable for use in the present invention.

Turning now to FIG. 4, there is shown a more detailed possible embodiment for the complex notch filter 50 shown in FIG. 3. The complex notch filter 50 is thus seen to comprise an I component storage register 410, a first real coefficients register 420, a first imaginary coefficients register 430, a first set of real terms multipliers 440, a first set of imaginary terms multipliers 450, a first real terms adder 460 and a first imaginary terms adder 470; a Q component storage register 510, a second real coefficient register 520, a second imaginary coefficient register 530, a second set of real terms multipliers 540, a second set of imaginary terms multipliers 550, a second real terms adder 560 and a second imaginary terms adder 570; and a first adder/subtractor 610 having a first 611 and second 612 input and a second adder/subtractor 620 having a first 621 and a second 622 input. I components storage register 410 stores I component data signal values I(k), I(k-1), I(k-2)... First real coefficients register 420, stores coefficients $C_{i0}$, $C_{i1}$, $C_{i2}$, ... First imaginary coefficients register 430, stores coefficients $C_{q0}$, $C_{q1}$, $C_{q2}$, ... The first set of real terms multipliers 440 perform the multiplications $C_{i0} \cdot I(k), C_{i1} \cdot I(k-1), C_{i2} \cdot I(k-2), \ldots$. The first set of imaginary terms multipliers 450 performs the multiplications $C_{q0} \cdot I(k), C_{q1} \cdot I(k-1), C_{q2} \cdot I(k-2), \ldots$ The first real terms adder 460 adds together the outputs of the first set of real terms multipliers 440 and the first imaginary terms adder 470, adds together the output products of the first set of imaginary terms multipliers 450.

Similarly, the Q components storage register 510 stores the Q component values Q(k),(Q(k-1), Q(k-2), ... Second real coefficients register 520 stores coefficients $C_{i0}$, $C_{i1}$, $C_{i2}$, ... Second imaginary coefficients register 530 stores coefficients $C_{q0}$, $C_{q1}$, $C_{q2}$, ... The second set of real terms multipliers 540 performs the multiplications $C_{i0} \cdot Q(k), C_{i1} \cdot Q(k-1), C_{i2} \cdot Q(k-2), \ldots$ The second set of imaginary terms multipliers 550 performs the multiplications $C_{q0} \cdot Q(k), C_{q1} \cdot Q(k-1), C_{q2} \cdot Q(k-2), \ldots$ Second real terms adder 560 adds together the products output by the second set of real terms multipliers 540 and the second imaginary terms adder 570 adds together the product output by the second set of imaginary terms multipliers 550.

The outputs of the first real 460 and imaginary 470 and the second real 560 and imaginary 570 terms adders correspond exactly to the output of the first real 310 and imaginary 320 and second real 330 and imaginary 340 notch FIR filters shown in FIG. 3 and similarly the first and second adder/subtractors 610, 620 correspond exactly to the first and second adder subtractors 350 and 360 of FIG. 3 and thus these will not be described in any detail.

Note that the structure of FIG. 3 suggests that a large number of multiplications need to be carried out in order to perform the FIR filter functions. However, the coefficients $C_{in}$, $C_{qn}$ are preferably chosen to be very simple and small numbers. In this way the multiplications are not, in fact, difficult and can often be performed simply by digitally shifting the numbers which are to be multiplied and/or by other techniques which would be well understood by a person skilled in the art. Preferably, the average number of digits per coefficient is less than 3 and ideally less than 2.5.

What is claimed is:

1. Apparatus for receiving and processing radio frequency signals, comprising a radio frequency to intermediate frequency down-conversion stage for receiving a radio frequency signal and outputting an intermediate frequency signal; an intermediate frequency to baseband down-conversion stage for receiving the intermediate frequency signal and outputting a base-band signal; and a complex notch-filter for receiving the base-band signal and outputting a notch-filtered baseband signal, wherein the complex notch-filter substantially filters out a small portion of the base-band signal centred about a first, non-zero, frequency whilst substantially passing a corresponding portion of the base-band signal centred about a second frequency having the same magnitude but opposite sign to the first frequency.

2. Apparatus as claimed in claim 1 further comprising an analogue to digital converter for converting one of the radio frequency, intermediate frequency or base-band signals from an analogue into a digital signal.

3. Apparatus as claimed in claim 2 wherein the analogue to digital converter is arranged to convert the intermediate frequency signal from an analogue signal into a digital signal.

4. Apparatus as claimed in claim 1 wherein the radio frequency to intermediate frequency down-conversion stage outputs the intermediate frequency signal as a complex intermediate frequency signal comprising first and second quadrature intermediate frequency component signals.

5. Apparatus as claimed in claim 4 wherein the frequency of said intermediate frequency signal is of the same order of magnitude as the bandwidth of the wanted signal.

6. Apparatus as claimed in claim 5 wherein the wanted signal is contained within one of a plurality of frequency division channels arranged in frequency such that corresponding points in adjacent channels are separated from one another by a channel separation frequency, and wherein the very low intermediate frequency about which the wanted signal is centred is approximately half the channel separation frequency.

7. Apparatus as claimed in claim 6 wherein the very low intermediate frequency about which the wanted signal is centred is within the range of half the channel separation frequency plus or minus 10%.

8. Apparatus as claimed in claim 6 wherein the very low intermediate frequency about which the wanted signal is centred is within tie range of half the channel separation frequency plus between 10% and 20%.

9. Apparatus as claimed in claim 5 wherein the complex notch-filter fiber includes inversion means whereby the outputs of one or more of the finite impulse response filters may be inverted to thereby alter the operation of the complex notch-filter such that the complex notch-filter substantially passes the small portion of the base-band signal centred about the first frequency whilst substantially filtering out the corresponding portion of the baseband signal centred about the second frequency.

10. Apparatus as claimed in claim 1 wherein the complex notch-filter includes first and second finite impulse response filters having different first and second sets of coefficients associated therewith respectively, wherein one of the sets of coefficients corresponds to the real parts of a set of complex coefficients and the other set of coefficients corresponds to the imaginary parts of the same set of complex coefficients.

11. Apparatus as claimed in claim 1 wherein the complex notch filter is programmable to enable the frequency of the small portion filtered out of the base-band signal to be altered as desired.

12. Apparatus as claimed in claim 1 wherein the complex notch filter has an asymmetrical response around the notch.

13. Apparatus as claimed in claim 1 being formed as an integrated circuit.

14. Apparatus for receiving and processing a wanted Radio Frequency signal comprising a radio frequency to intermediate frequency down-conversion stage for receiving the wanted radio frequency signal and out-putting a complex intermediate frequency signal; an analogue to digital convener for converting the complex intermediate frequency signal to a digital complex intermediate signal; an intermediate frequency to base-band down-conversion stage for receiving the digital complex intermediate frequency signal and out-putting a digital complex base-band signal; and a complex notch filter for receiving the digital complex base-band signal and out-putting a notch filtered digital complex base-band signal wherein the complex notch filter substantially filters out a small portion of the base-band signal centred about a first, non-zero, frequency while substantially passing a corresponding portion of the base-band signal centred about a second frequency having the same magnitude but opposite sign to the first frequency.

15. A method of receiving and processing a wanted Radio Frequency signal comprising the steps of keeping the wanted Radio Frequency signal and down-converting it to complex intermediate frequency signal; converting the complex intermediate frequency signal from an analogue signal into a corresponding digital signal; converting the digital intermediate frequency to a digital base-band signal; and filtering the digital base-band signal with a complex notch filter in order to filter out a small portion of the base-band signal centred about a first, non-zero frequency whilst substantially passing a corresponding portion of the baseband signal centred about a second frequency having the same magnitude but opposite sign to the first frequency.

\* \* \* \* \*

UNITED STATES PATENT AND TRADEMARK OFFICE
CERTIFICATE OF CORRECTION

PATENT NO.   : 6,678,340 B1                                              Page 1 of 1
DATED        : January 13, 2004
INVENTOR(S)  : Nadim Khlat et al.

It is certified that error appears in the above-identified patent and that said Letters Patent is hereby corrected as shown below:

Column 10,
Line 41, change "baseband" to -- base-band --.

Column 11,
Line 10, change "tie" to -- the --.
Line 19, change "baseband" to -- base-band --.

Column 12,
Line 6, change "vener" to -- verter --.

Signed and Sealed this

Twenty-fifth Day of April, 2006

JON W. DUDAS
*Director of the United States Patent and Trademark Office*